United States Patent
Hembacher

(10) Patent No.: US 11,092,897 B2
(45) Date of Patent: Aug. 17, 2021

(54) METHOD FOR PRODUCING A MIRROR AS AN OPTICAL COMPONENT FOR AN OPTICAL SYSTEM OF A PROJECTION EXPOSURE APPARATUS FOR PROJECTION LITHOGRAPHY

(71) Applicant: Carl Zeiss SMT GmbH, Oberkochen (DE)

(72) Inventor: Stefan Hembacher, Bobingen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 16/811,378

(22) Filed: Mar. 6, 2020

(65) Prior Publication Data

US 2020/0206855 A1    Jul. 2, 2020

Related U.S. Application Data

(63) Continuation of application No. PCT/EP2018/072597, filed on Aug. 22, 2018.

(30) Foreign Application Priority Data

Sep. 18, 2017   (DE) .......................... 102017216458.1

(51) Int. Cl.
*G03F 7/20* (2006.01)
*B23Q 5/04* (2006.01)

(52) U.S. Cl.
CPC ............. *G03F 7/7015* (2013.01); *B23Q 5/04* (2013.01); *G03F 7/70233* (2013.01)

(58) Field of Classification Search
CPC ....... B23Q 5/04; G02B 17/06; G03F 7/70033; G03F 7/7015; G03F 7/70233;
(Continued)

(56) References Cited

U.S. PATENT DOCUMENTS

2007/0058269 A1    3/2007   Mann et al.
2010/0226028 A1    9/2010   Antonille et al.
(Continued)

FOREIGN PATENT DOCUMENTS

DE    10 2010 029 050 A1    3/2011
DE    10 2012 212 953 A1    6/2013
(Continued)

OTHER PUBLICATIONS

German Examination Report, with translation thereof, for corresponding DE Appl No. 10 2017 216 458.1, dated Apr. 26, 2018.
(Continued)

*Primary Examiner* — Colin W Kreutzer
(74) *Attorney, Agent, or Firm* — Fish & Richardson P.C.

(57) ABSTRACT

When producing a mirror as an optical component for an optical system of a projection exposure apparatus for projection lithography, first, an average value of a global gravitational acceleration is determined. Next, a gravitational acceleration difference between the gravitational acceleration at the production location and the gravitational acceleration average value is determined. After a determination of a target surface shape of a reflection surface of the mirror, a mirror substrate is machined at the production location taking into consideration the gravitational acceleration difference in a manner such that, under the influence of the gravitational acceleration average value, a current surface shape of the reflection surface of the mirror substrate does not deviate from the target surface shape by more than a prescribed figure tolerance value ($P_{max}$). The result is an optical element with a relatively small figure at a use location of the mirror.

20 Claims, 5 Drawing Sheets

(58) Field of Classification Search
CPC .. G03F 7/70258; G03F 7/70316; G03F 7/705; G03F 7/70591; G03F 7/706; G03F 7/70825; G03F 7/70975
USPC ........ 355/51, 52, 67, 77; 359/359–360, 838, 359/846
See application file for complete search history.

(56) References Cited

U.S. PATENT DOCUMENTS

| | | | | |
|---|---|---|---|---|
| 2011/0235012 A1* | 9/2011 | Fischer | ............... | G03F 7/70991 355/67 |
| 2014/0016109 A1* | 1/2014 | Hauf | .................. | G03F 7/70766 355/71 |
| 2014/0176927 A1* | 6/2014 | Kwan | ..................... | G03F 7/709 355/67 |
| 2015/0029479 A1* | 1/2015 | Graeschus | ............ | G03F 7/7085 355/67 |

FOREIGN PATENT DOCUMENTS

| | | |
|---|---|---|
| DE | 10 2013 214 989 A1 | 8/2014 |
| WO | WO 2009/053023 A2 | 4/2009 |
| WO | WO 2016/166080 A1 | 10/2016 |
| WO | WO 2016/188934 A1 | 12/2016 |

OTHER PUBLICATIONS

International Search Report and Written Opinion, for corresponding PCT Appl No. PCT/EP2018/072597, dated Nov. 30, 2018.
Bloemhof E. E. et al. "Extracting the zero-gravity surface figure of a mirror", SPIE, PO Box 10 Bellingham WA 98227-0010, USA, vol. 7013, No. 70133L, Dec. 1, 2008, pp. 1-12.

* cited by examiner

METHOD FOR PRODUCING A MIRROR AS AN OPTICAL COMPONENT FOR AN OPTICAL SYSTEM OF A PROJECTION EXPOSURE APPARATUS FOR PROJECTION LITHOGRAPHY

CROSS-REFERENCE TO RELATED APPLICATIONS

The present application is a continuation of, and claims benefit under 35 USC 120 to, international application PCT/EP2018/072597, filed Aug. 22, 2018, which claims benefit under 35 USC 119 of German Application No. 10 2017 216 458.1, filed Sep. 18, 2017. The entire disclosure of these applications are incorporated by reference herein.

FIELD

The disclosure relates to a method for producing a mirror as an optical component for an optical system of a projection exposure apparatus for projection lithography. Further, the disclosure relates to a mirror produced in this way, an optical system of a projection exposure apparatus for projection lithography having such a mirror, a projection exposure apparatus having such an optical system, a method for producing a microstructured or nanostructured component using such a projection exposure apparatus and a microstructured or nanostructured component produced by this method.

BACKGROUND

Optical elements are known from DE 10 2013 214 989 A1. Imaging optical units are known from WO 2016/188934 A1 and WO 2016/166080 A1. DE 10 2012 212 953 A1 discloses a lithographic mirror arrangement.

SUMMARY

The disclosure seeks to provide an optical element with the smallest possible figure at a use location of the mirror.

According to an aspect, the disclosure provides a method for producing a mirror as an optical component for an optical system of a projection exposure apparatus for projection lithography. The method includes:
determining an average value of a global gravitational acceleration;
determining a gravitational acceleration difference between the gravitational acceleration at the production location and the gravitational acceleration average value;
determining a target surface shape of a reflection surface of the mirror; and
machining a mirror substrate at the production location taking into consideration the gravitational constant difference in a manner such that, under the influence of the gravitational acceleration average value, a current surface shape of the reflection surface of the mirror substrate does not deviate from the target surface shape by more than a prescribed figure tolerance value ($P_{max}$).

It has been found in accordance with the disclosure that a maximum figure, that is to say a maximum deviation of a surface shape from a mirror reflection surface, can be reduced, with otherwise identical production conditions, if during the production of the mirror a deviation of a gravitational acceleration (erroneously referred to as gravitational constant in DE 10 2017 216 458.1) at the production location from an average value of a global gravitational acceleration at various possible use locations of the mirror is taken into consideration. This average value can be determined in weighted fashion in dependence on the use location and/or taking into account the delivery probability to the respective use location. Since the gravitational acceleration at the production location generally deviates from the average value of the determined global gravitational acceleration, this difference consideration results in a reduction of the maximum resulting figure at the use location. As a result, viewed over all use locations, the figure of a mirror produced in this way is on average lower than if this difference consideration is omitted. In particular, a defocus aberration of the mirror can be significantly reduced by way of the production method.

In some embodiments, for ascertaining whether, under the influence of the gravitational acceleration average value, a deviation between the current surface shape and the target surface shape of the reflection surface that is within the figure tolerance value ($P_{max}$) is kept, the following procedure is performed:
calculating a target allowance surface shape, which the reflection surface of the mirror must have at the production location so that, under the influence of the gravitational acceleration average value, in a use position of the mirror the target surface shape results; and
machining the mirror substrate at the production location in a manner such that a current surface shape of the reflection surface of the mirror substrate does not deviate from the target allowance surface shape by more than a prescribed figure allowance tolerance value. Such a target allowance simplifies the production of the mirror. The figure allowance tolerance value during production of the allowance surface shape does not need to be the same as the figure tolerance value noted in the preceding paragraph.

Advantages of a mirror made by these methods, an optical system including such a mirror, a projection exposure apparatus including such an optical system, a production method for microstructured or nanostructured components using these methods and a microstructured or nanostructured component so produced correspond to those that have already been explained above with reference to the optical element according to the disclosure. In particular, a semiconductor component, for example a memory chip, may be produced using the projection exposure apparatus.

The light source can be an EUV light source. Alternatively, use can also be made of a DUV light source, that is to say, for example, a light source with a wavelength of 193 nm.

BRIEF DESCRIPTION OF THE DRAWINGS

Exemplary embodiments of the disclosure is explained in greater detail below with reference to the drawings, in which.

DESCRIPTION OF EXEMPLARY EMBODIMENTS

Figure 1:
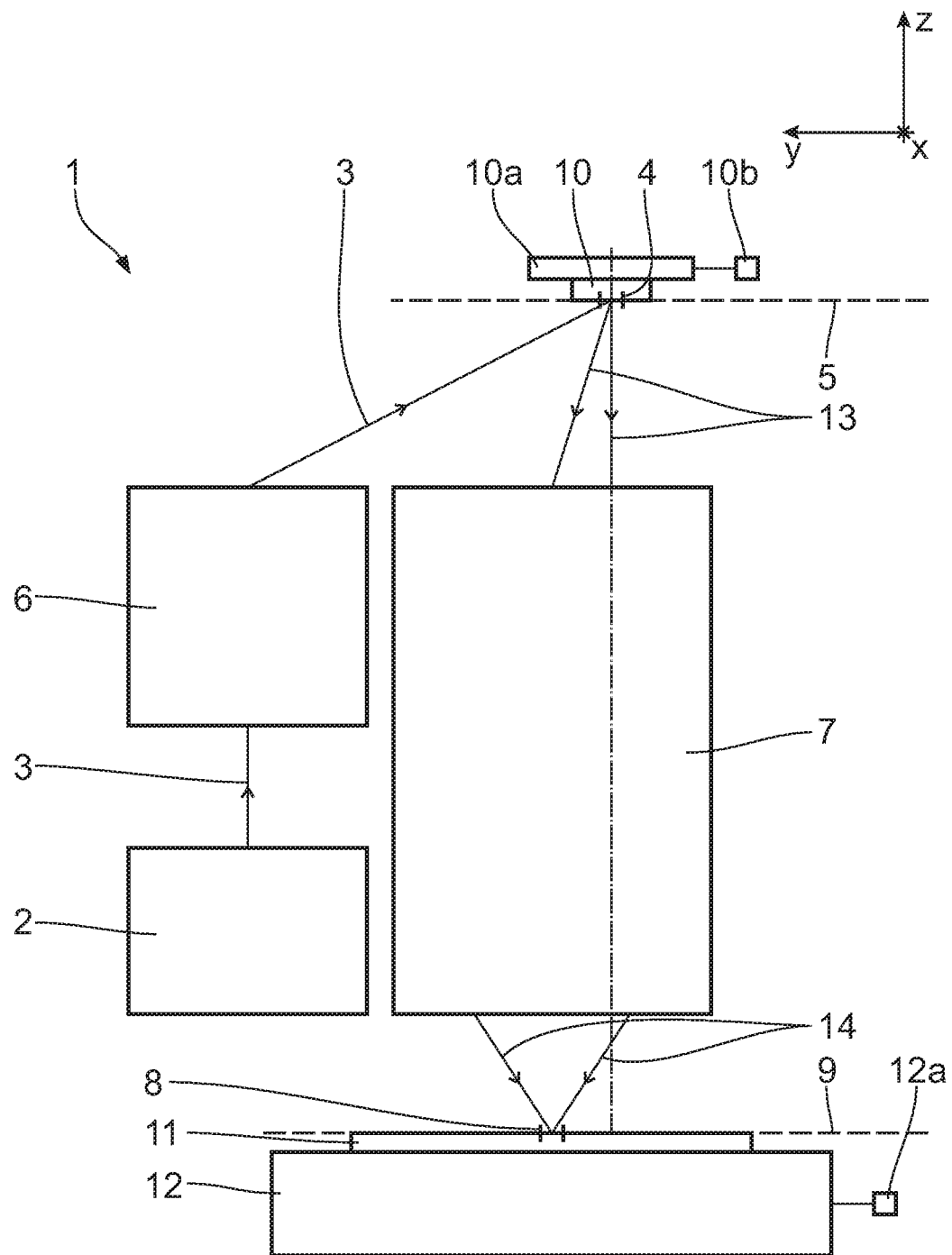
FIG. 1 schematically shows a projection exposure apparatus for EUV microlithography.

A microlithographic projection exposure apparatus 1 has a light source 2 for illumination light or imaging light 3. The light source 2 is an EUV light source, which produces light in a wavelength range of e.g. between 5 nm and 30 nm, in particular between 5 nm and 15 nm. The light source 2 can be a plasma-based light source (laser-produced plasma (LPP), gas-discharge produced plasma (GDP)) or else a synchrotron-based light source, for example a free electron laser (FEL). In particular, the light source 2 may be a light source with a wavelength of 13.5 nm or a light source with a wavelength of 6.9 nm. Other EUV wavelengths are also possible. In general, even arbitrary wavelengths are possible for the illumination light 3 guided in the projection exposure apparatus 1, for example visible wavelengths or else other wavelengths which may find use in microlithography (for example, DUV, deep ultraviolet) and for which suitable laser light sources and/or LED light sources are available (e.g. 365 nm, 248 nm, 193 nm, 157 nm, 129 nm, 109 nm). A beam path of the illumination light 3 is depicted very schematically in FIG. 1.

An illumination optical unit 6 serves to guide the illumination light 3 from the light source 2 to an object field 4 in an object plane 5. Using a projection optical unit or imaging optical unit 7, the object field 4 is imaged into an image field 8 in an image plane 9 with a predetermined reduction scale.

In order to facilitate the description of the projection exposure apparatus 1 and the various embodiments of the projection optical unit 7, a Cartesian xyz-coordinate system is indicated in the drawing, from which system the respective positional relationship of the components illustrated in the figures is evident. In FIG. 1, the x-direction runs perpendicular to the plane of the drawing into the latter. The y-direction runs towards the left, and the z-direction runs upward.

In the projection optical unit 7, the object field 4 and the image field 8 have a bent or curved embodiment and, in particular, an embodiment shaped like a partial ring. A radius of curvature of this field curvature can be 81 mm on the image side. A corresponding ring field radius of the image field is defined in WO 2009/053023 A2. A basic form of a marginal contour of the object field 4 or of the image field 8 has a corresponding bend. Alternatively, it is possible to embody the object field 4 and the image field 8 with a rectangular shape. The object field 4 and the image field 8 have an x/y-aspect ratio of greater than 1. Therefore, the object field 4 has a longer object field dimension in the x-direction and a shorter object field dimension in the y-direction. These object field dimensions extend along the field coordinates x and y.

Accordingly, the object field 4 is spanned by the first Cartesian object field coordinate x and the second Cartesian object field coordinate y. The third Cartesian coordinate z, which is perpendicular to these two object field coordinates x and y, is also referred to as normal coordinate below.

The projection optical unit 7 has an x-dimension of the image field of 26 mm and a y-dimension of the image field 8 of 1.2 mm.

Figure 2:
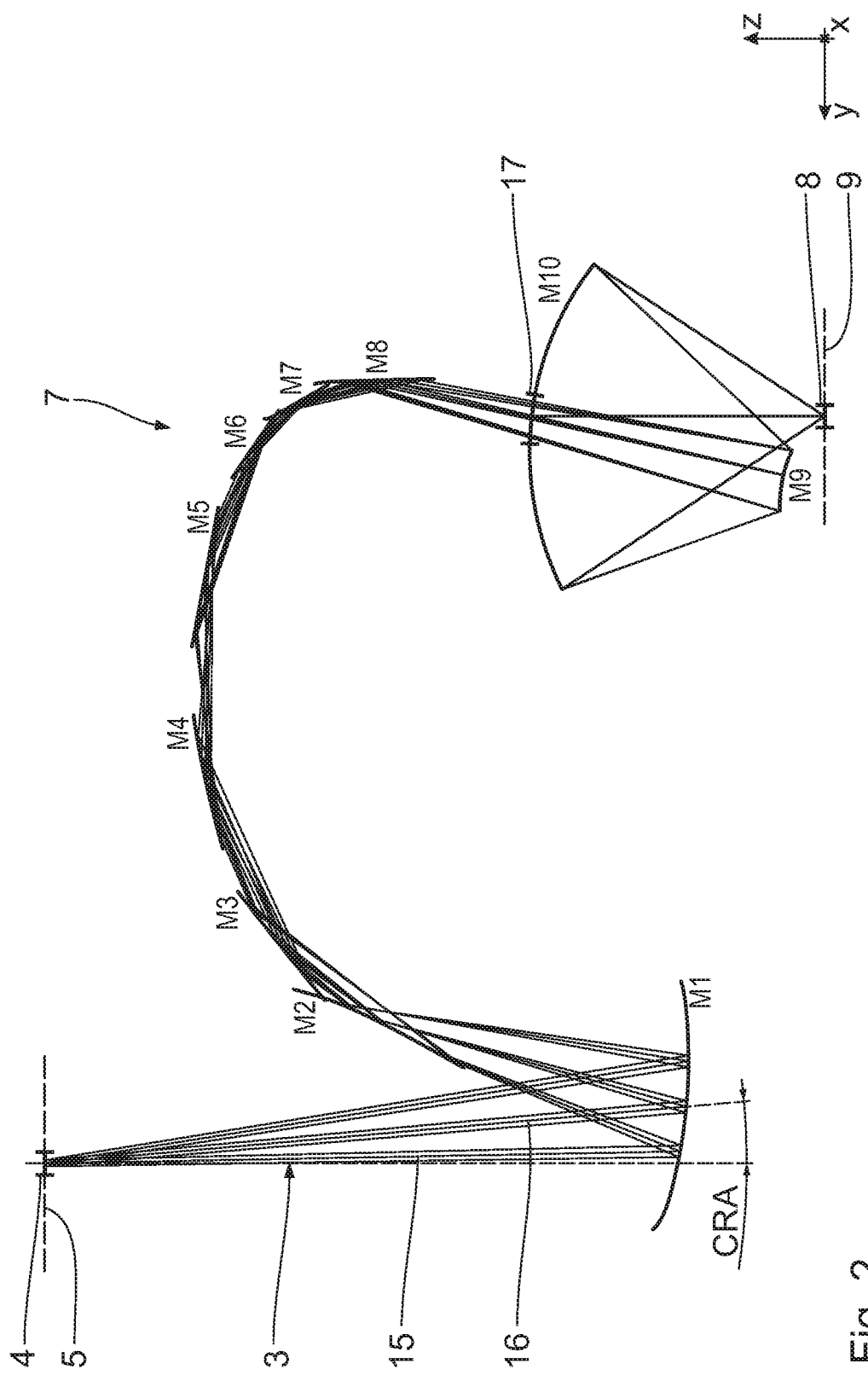
FIG. 2 shows, in a meridional section, an embodiment of an imaging optical unit which can be used as a projection lens in the projection exposure apparatus according to FIG. 1, wherein an imaging beam path for chief rays and for an upper coma ray and a lower coma ray of three selected field points is depicted.
Figure 3:
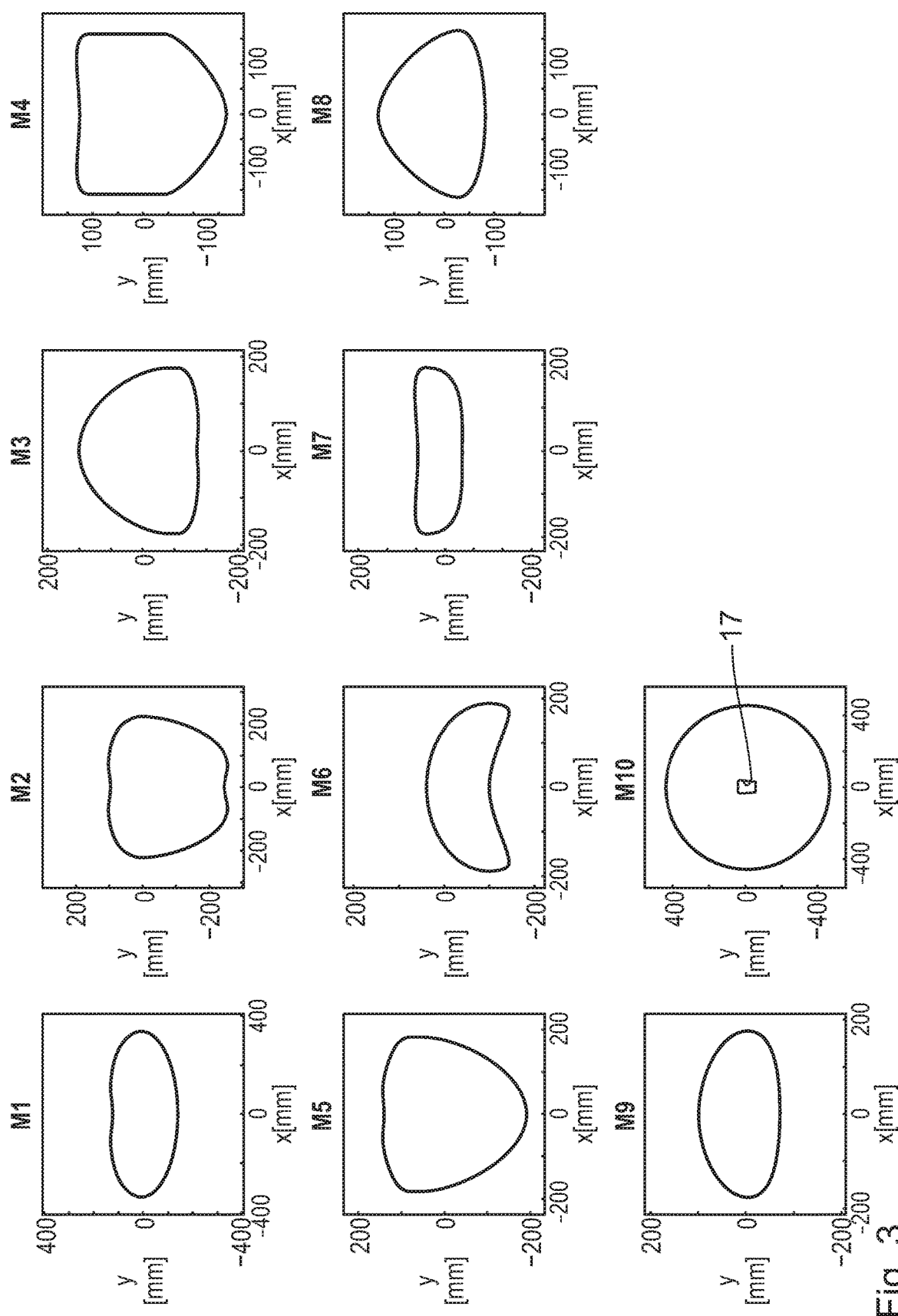
FIG. 3 shows marginal contours of used mirror surfaces of mirrors of the imaging optical unit according to FIG. 2.

The exemplary embodiment depicted in FIG. 2 can be used for the projection optical unit 7. The optical design of the projection optical unit 7 according to FIGS. 2 and 3 is known from WO 2016/188934 A1, the content of which is referred to in its entirety.

In the embodiment of the projection optical unit 7 according to FIG. 2, the image plane 9 is arranged parallel to the object plane 5. What is imaged in this case is a section of a reflection mask 10, also referred to as reticle, coinciding with the object field 4. The reticle 10 is carried by a reticle holder 10a. The reticle holder 10a is displaced by a reticle displacement drive 10b.

The imaging by way of the projection optical unit 7 is implemented on the surface of a substrate 11 in the form of a wafer, which is carried by a substrate holder 12. The substrate holder 12 is displaced by a wafer or substrate displacement drive 12a.

FIG. 1 schematically illustrates, between the reticle 10 and the projection optical unit 7, a ray beam 13 of the illumination light 3 that enters into the projection optical unit and, between the projection optical unit 7 and the substrate 11, a ray beam 14 of the illumination light 3 that emerges from the projection optical unit 7. An image field-side numerical aperture (NA) of the projection optical unit 7 is not reproduced to scale in FIG. 1.

The projection exposure apparatus 1 is of the scanner type. Both the reticle 10 and the substrate 11 are scanned in the y-direction during the operation of the projection exposure apparatus 1. A stepper type of the projection exposure apparatus 1, in which a stepwise displacement of the reticle 10 and of the substrate 11 in the y-direction is effected between individual exposures of the substrate 11, is also possible. These displacements are effected synchronously to one another by an appropriate actuation of the displacement drives 10b and 12a.

FIG. 2 shows the optical design of the projection optical unit 7. FIG. 2 shows the projection optical unit 7 in a meridional section, i.e. the beam path of the imaging light 3 in the yz-plane. The projection optical unit 7 according to FIG. 2 has a total of ten mirrors, which are numbered consecutively by M1 to M10 in the order of the beam path of the individual rays 15, proceeding from the object field 4.

FIG. 2 depicts the beam path of in each case three individual rays 15 emanating from three object field points which are spaced apart from one another in the y-direction in FIG. 2. What are depicted are chief rays 16, i.e. individual rays 15 which pass through the centre of a pupil in a pupil plane of the projection optical unit 7, and in each case an upper coma ray and a lower coma ray of these two object field points. Proceeding from the object field 4, the chief rays 16 include an angle CRA of 5.2° with a normal of the object plane 5.

The object plane 5 lies parallel to the image plane 9.

FIG. 2 depicts sections of the calculated reflection surfaces of the mirrors M1 to M10. A portion of these calculated reflection surfaces is used. Only this actually used region of the reflection surfaces, plus an overhang, is actually present in the real mirrors M1 to M10.

FIG. 3 shows this actually used region of the reflection surfaces of the mirrors M1 to M10. The mirror M10 has a passage opening 17 for the passage of the imaging light 3 which is reflected from the antepenultimate mirror M8 towards the penultimate mirror M9. The mirror M10 is used in a reflective manner around the passage opening 17. None of the other mirrors M1 to M9 has passage openings and the mirrors are used in a reflective manner in a continuous region without gaps.

The mirrors M1 to M10 are embodied as free-form surfaces which cannot be described by a rotationally symmetric function. Other embodiments of the projection optical unit 7, in which at least one of the mirrors M1 to M10 is embodied as a rotationally symmetric asphere, are also possible. An asphere equation for such a rotationally symmetric asphere is known from DE 10 2010 029 050 A1. It is also possible for all mirrors M1 to M10 to be embodied as such aspheres.

A free-form surface can be described by the following free-form surface equation (equation 1):

$$Z = \frac{c_x x^2 + c_y y^2}{1 + \sqrt{1 - (1+k_x)(c_x x)^2 - (1+k_y)(c_y y)^2}} + \quad (1)$$

$$C_1 x + C_2 y + C_3 x^2 + C_4 xy + C_5 y^2 + C_6 x^3 + \ldots +$$

$$C_9 y^3 + C_{10} x^4 + \ldots + C_{12} x^2 y^2 + \ldots + C_{14} y^4 + C_{15} x^5 +$$

$$\ldots + C_{20} y^5 + C_{21} x^6 + \ldots + C_{24} x^3 y^3 + \ldots + C_{27} y^6 + \ldots$$

The following applies to the parameters of this equation (1):

Z is the sag of the free-form surface at the point x, y, where $x^2 + y^2 = r^2$. Here, r is the distance from the reference axis of the free-form surface equation (x=0; y=0).

In the free-form surface equation (1), $C_1$, $C_2$, $C_3$ . . . denote the coefficients of the freeform surface series expansion in powers of x and y.

In the case of a conical base area, $c_x$, $c_y$ is a constant corresponding to the vertex curvature of a corresponding asphere. Thus, $c_x = 1/R_x$ and $c_y = 1/R_y$ applies. $k_x$ and $k_y$ each correspond to a conical constant of a corresponding asphere. Thus, equation (1) describes a biconical free-form surface.

An alternative possible free-form surface can be generated from a rotationally symmetric reference surface. Such free-form surfaces for reflection surfaces of the mirrors of projection optical units of microlithographic projection exposure apparatuses are known from US 2007-0058269 A1.

Alternatively, free-form surfaces can also be described with the aid of two-dimensional spline surfaces. Examples for this are Bezier curves or non-uniform rational basis splines (NURBS). By way of example, two-dimensional spline surfaces can be described by a grid of points in an xy-plane and associated z-values, or by these points and gradients associated therewith. Depending on the respective type of the spline surface, the complete surface is obtained by interpolation between the grid points using for example polynomials or functions which have specific properties in respect of the continuity and the differentiability thereof. Examples for this are analytical functions.

The used reflection surfaces of the mirrors M1 to M10 are carried by main bodies.

The main body 18 can be manufactured from glass, from ceramics or from glass ceramics. The material of the main body 18 can be matched in such a way that its coefficient of thermal expansion at a selected operating temperature of the mirror M lies very close to the value of 0 and ideally is exactly 0. Zerodur® is an example of such a material.

Figure 4:
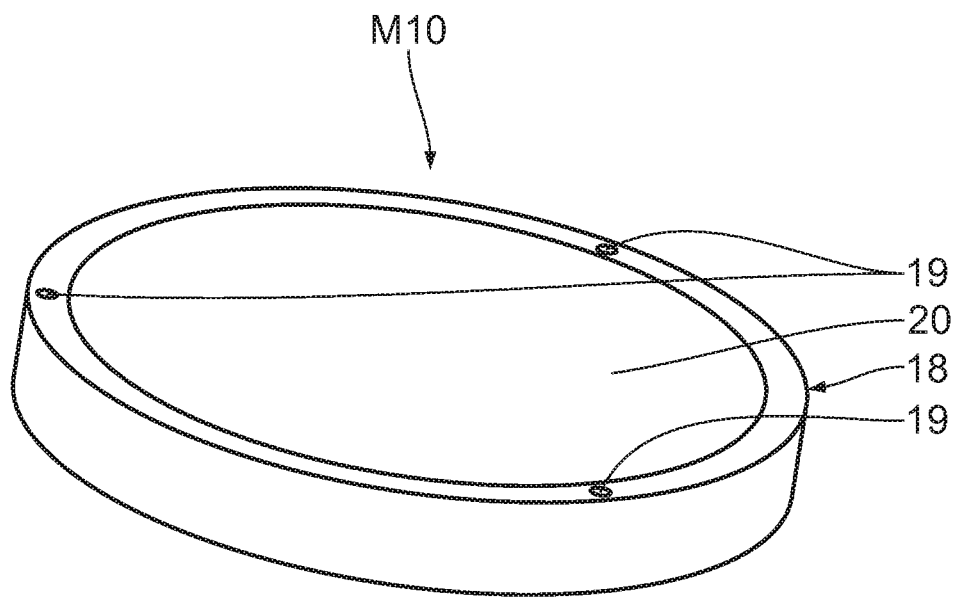
FIG. 4 shows perspectively a mirror of the imaging optical unit according to FIG. 2.

FIG. 4 perspectively shows one of the mirrors of the projection optical unit 7, specifically the mirror M10, wherein the passage opening 17 is omitted.

A mirror substrate or main body 18 of the mirror M10 has three mounting openings 19 for retaining the mirror substrate 18 at a mirror holder.

Figure 5:
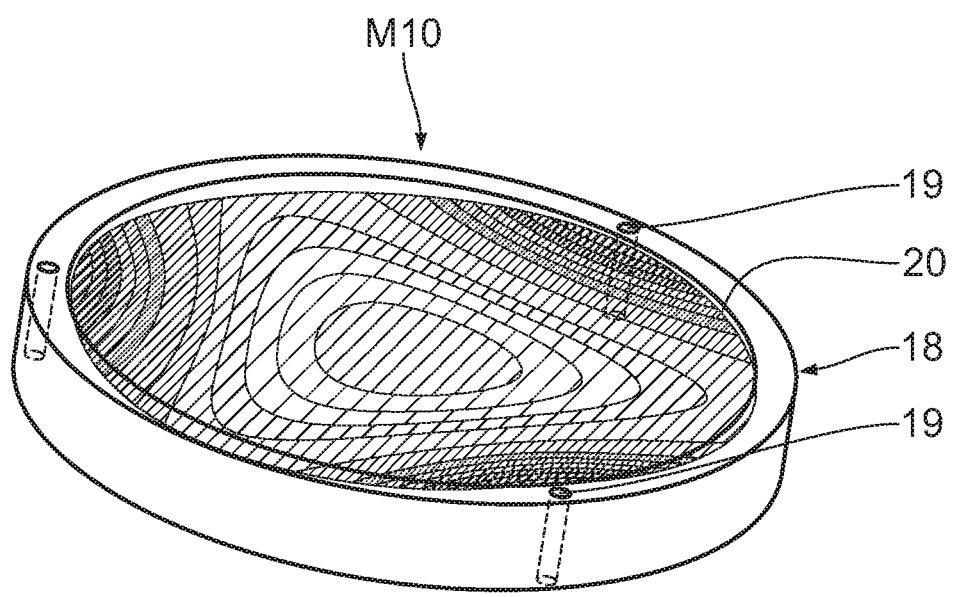
FIG. 5 shows a deviation of a current surface shape of a reflection surface of a mirror substrate of the mirror according to FIG. 4 from a target surface shape.

FIG. 5 illustrates a figure of the mirror M10, that is to say a deviation of a current surface shape of a reflection surface 20 of the mirror M10 from an optimum target surface shape. An overall absolute value region of the illustrated figure is divided into a plurality of value region sections, which are reproduced in each case with different hatchings and between which figure isolines extend. The corresponding figure values are given in FIG. 5 on the left from the bottom to the top in absolute increasing fashion in arbitrary units.

Due to the threefold arrangement of the mounting points of the mirror substrate 18 over the mounting openings 19, a correspondingly threefold pattern of the figure occurs. In the region of the mounting openings 19, the figure is minimum and in each case increases continuously up to the centre of the reflection surface 20, where the figure is maximum. In the circumferential direction around the mirror substrate 18, the figure in the circumferential positions is maximum in each case between two mounting openings 19 and is here approximately half the maximum figure at the centre of the reflection surface 20.

A typical order of magnitude of the maximum figure is around 10 μm. Depending on the diameter of the mirror, depending on the number, the arrangement and the type of the mounting points, depending on the material and on the thickness of the mirror substrate and also depending on the installation position of the mirror, a greater maximum figure, for example in the region of 100 μm, or a smaller figure, for example in the order of magnitude of 1 μm, can also result.

The mirror M10 is produced as follows:

First, the average value of a global gravitational acceleration is taken as a basis. Used here is a possibly weighted average value of the gravitational acceleration at the possible use locations of the projection exposure apparatus 1, that is to say, for example, at customer sites. This average value of the global gravitational acceleration that is used can be, for example, 9.80 m/s². Included in the determination of the average value of the global gravitational acceleration can be a delivery probability of the mirror at the respective use location, with the result that use locations having a higher delivery probability are included in the average value determination with a higher weighting.

Next, a gravitational acceleration difference between the gravitational acceleration at the production location and the determined gravitational acceleration average value is determined. The gravitational acceleration at the production location can be 9.81 m/s², for example, such that the gravitational acceleration difference is 0.01 m/s².

Furthermore determined in the production method is a target surface shape of the reflection surface 20 of the mirror M10.

The mirror substrate 18 is then machined at the production location taking into consideration the gravitational acceleration difference in a manner such that, under the influence of the gravitational acceleration average value, a current surface shape of the reflection surface 20 of the mirror substrate 18 does not deviate from the target surface shape by more than a prescribed figure tolerance value.

To ascertain whether, under the influence of the gravitational acceleration average value, a deviation between the current surface shape and the target surface shape is kept within the figure tolerance value, the following procedure is followed:

First, a target allowance surface shape is calculated, which the reflection surface of the mirror M10 must have at the production location so that, under the influence of the gravitational acceleration average value, the target surface shape results. The mirror substrate 18 is then machined at the production location in a manner such that a current surface shape of the reflection surface of the mirror substrate 18 does not deviate from the target allowance surface shape by more than a prescribed figure allowance tolerance value.

Both the figure tolerance value and the figure allowance tolerance value are lower than 1 nm and can be lower than 100 pm or can also be lower than 10 pm.

Figure 6:
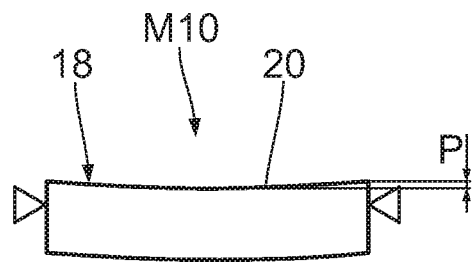
FIG. 6 shows the mirror according to FIG. 4 after the machining thereof at the production location taking into consideration a gravitational acceleration difference between the gravitational acceleration at the production location and a gravitational acceleration average value.

FIG. 6 shows the correspondingly produced mirror M10 at the production location. The figure P of the mirror M10 is illustrated in a greatly exaggerated manner in FIG. 6. This figure represents a deviation of the current surface shape of the reflection surface from the target surface shape at the production location.

Figure 7:
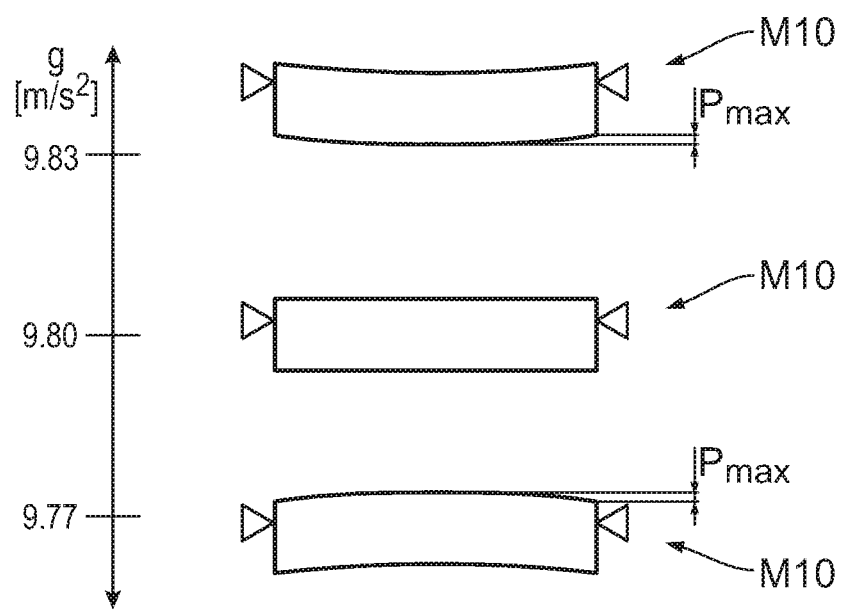
FIG. 7 shows the mirror, which has been manufactured with an allowance in accordance with FIG. 6, at three alternative use locations with three different use-location gravitational accelerations.

FIG. 7 shows in an illustration that is similar to FIG. 6 the mirror M10, produced in accordance with FIG. 6, at three different use locations with three different gravitational accelerations. The gravitational acceleration can be gathered from the scale that is illustrated on the left in FIG. 7.

FIG. 7 shows, at the top, the mirror M10 at a use location having the greatest gravitational acceleration 9.83 m/s$^2$. The figure here has the maximum value $P_{max}$, which is slightly greater than the figure due to the target allowance surface shape in accordance with FIG. 6.

FIG. 7 shows, at the centre, the mirror M10 at a use location, at which the considered average value of the global gravitational acceleration, 9.80 m/s$^2$, prevails. Here, the figure which is attainable in principle equals 0, because the allowance surface shape during manufacture in accordance with FIG. 6 was matched precisely to this gravitational acceleration average value.

FIG. 7 shows, at the bottom, the mirror M10 at a use location having the minimum gravitational acceleration 9.77 m/s$^2$. The result is an absolutely likewise maximum figure $P_{max}$ with the same absolute value and opposite sign as compared to the maximum figure $P_{max}$ in accordance with FIG. 7 at the top.

Due to the consideration of the allowance surface shape with figure P in accordance with FIG. 6, a lower figure travel between 0 and $P_{max}$ is realized at the different possible use locations with the same attainable manufacturing tolerances.

In order to produce a microstructured or nanostructured component, the projection exposure apparatus 1 is used as follows: First, the reflection mask 10 or the reticle and the substrate or the wafer 11 are provided. Subsequently, a structure on the reticle 10 is projected onto a light-sensitive layer of the wafer 11 with the aid of the projection exposure apparatus 1. Then, a microstructure or nanostructure on the wafer 11, and hence the microstructured component, is produced by developing the light-sensitive layer.

What is claimed is:

1. A method of making a mirror comprising a mirror substrate and a reflection surface, the method comprising:
    machining the mirror substrate at a production location taking into consideration a difference between a value of a gravitational acceleration at the production location and an average value of a global gravitational acceleration so that, under the influence of the average value of the global gravitational acceleration, a current surface shape of a reflection surface of the mirror substrate does not deviate from a target surface shape of the reflection surface of the mirror by more than a prescribed figure tolerance value.

2. The method of claim 1, further comprising, before machining, determining the average value of the global gravitational acceleration.

3. The method of claim 2, further comprising, between determining the average value of the global gravitational acceleration and machining, determining the difference between the value of the gravitational acceleration at the production location and the average value of the global gravitational acceleration.

4. The method of claim 3, further comprising, between the determining the difference and machining, determining the target surface shape of the reflection surface of the mirror.

5. The method of claim 4, further comprising, after machining, forming the reflective surface of the mirror supported on the mirror substrate.

6. The method of claim 5, further comprising, for determining whether the deviation between the current surface shape of the reflection surface of the mirror substrate and the target surface shape of the reflection surface of the mirror is within the prescribed figure tolerance value:
    calculating a target allowance surface shape that the reflection surface of the mirror must have at the production location so that, under the influence of the average value of the global gravitational acceleration, the mirror has the target surface shape of the reflection surface of the mirror; and
    machining the mirror substrate at the production location so that the current surface shape of the reflection surface of the mirror substrate does not deviate from the target allowance surface shape by more than a prescribed figure allowance tolerance value.

7. The method of claim 4, further comprising, for determining whether the deviation between the current surface shape of the reflection surface of the mirror substrate and the target surface shape of the reflection surface of the mirror is within the prescribed figure tolerance value:
    calculating a target allowance surface shape that the reflection surface of the mirror must have at the production location so that, under the influence of the average value of the global gravitational acceleration, the mirror has the target surface shape of the reflection surface of the mirror; and
    machining the mirror substrate at the production location so that the current surface shape of the reflection surface of the mirror substrate does not deviate from the target allowance surface shape by more than a prescribed figure allowance tolerance value.

8. The method of claim 7, further comprising, after machining, forming the reflective surface of the mirror supported on the mirror substrate.

9. The method of claim 3, further comprising, for determining whether the deviation between the current surface shape of the reflection surface of the mirror substrate and the target surface shape of the reflection surface of the mirror is within the prescribed figure tolerance value:
    calculating a target allowance surface shape that the reflection surface of the mirror must have at the production location so that, under the influence of the average value of the global gravitational acceleration, the mirror has the target surface shape of the reflection surface of the mirror; and machining the mirror substrate at the production location so that the current surface shape of the reflection surface of the mirror substrate does not deviate from the target allowance surface shape by more than a prescribed figure allowance tolerance value.

10. The method of claim 9, further comprising, after machining, forming the reflective surface of the mirror supported on the mirror substrate.

11. The method of claim 2, further comprising, for determining whether the deviation between the current surface shape of the reflection surface of the mirror substrate and the target surface shape of the reflection surface of the mirror is within the prescribed figure tolerance value:

calculating a target allowance surface shape that the reflection surface of the mirror must have at the production location so that, under the influence of the average value of the global gravitational acceleration, the mirror has the target surface shape of the reflection surface of the mirror; and machining the mirror substrate at the production location so that the current surface shape of the reflection surface of the mirror substrate does not deviate from the target allowance surface shape by more than a prescribed figure allowance tolerance value.

12. The method of claim 11, further comprising, after machining, forming the reflective surface of the mirror supported on the mirror substrate.

13. The method of claim 1, further comprising, for determining whether the deviation between the current surface shape of the reflection surface of the mirror substrate and the target surface shape of the reflection surface of the mirror is within the prescribed figure tolerance value:

calculating a target allowance surface shape that the reflection surface of the mirror must have at the production location so that, under the influence of the average value of the global gravitational acceleration, the mirror has the target surface shape of the reflection surface of the mirror; and machining the mirror substrate at the production location so that the current surface shape of the reflection surface of the mirror substrate does not deviate from the target allowance surface shape by more than a prescribed figure allowance tolerance value.

14. The method of claim 13, further comprising, after machining, forming the reflective surface of the mirror supported on the mirror substrate.

15. The method of claim 14, further comprising using the mirror in a lithography projection exposure system.

16. The method of claim 15, further comprising using the lithography projection exposure system to produce a structured component.

17. The method of claim 1, further comprising, after machining, forming the reflective surface of the mirror supported on the mirror substrate.

18. The method of claim 17, further comprising using the mirror in an optical system.

19. The method of claim 17, further comprising using the mirror in a lithography projection exposure system.

20. The method of claim 19, further comprising using the lithography projection exposure system to produce a structured component.

* * * * *